United States Patent
Kirk et al.

(10) Patent No.: US 6,419,742 B1
(45) Date of Patent: Jul. 16, 2002

(54) METHOD OF FORMING LATTICE MATCHED LAYER OVER A SURFACE OF A SILICON SUBSTRATE

(75) Inventors: Wiley P. Kirk, College Station; Joe X. Zhou, Houston; Bruce E. Gnade, Dallas; Chih-Chen Cho, Richardson, all of TX (US)

(73) Assignees: Texas Instruments Incorporated, Dallas, TX (US); Texas A&M University System, College Station, TX (US)

( * ) Notice: Subject to any disclaimer, the term of this patent is extended or adjusted under 35 U.S.C. 154(b) by 0 days.

(21) Appl. No.: 08/340,097

(22) Filed: Nov. 15, 1994

(51) Int. Cl.$^7$ ............................................... C30B 25/14
(52) U.S. Cl. ............................ 117/84; 117/90; 438/761; 438/763
(58) Field of Search .................................. 437/132, 126, 437/133, 108; 148/DIG. 64; 117/84, 90; 438/761, 763

(56) References Cited

U.S. PATENT DOCUMENTS

| | | | | |
|---|---|---|---|---|
| 4,910,167 A | * | 3/1990 | Lee et al. | 437/111 |
| 5,262,633 A | * | 11/1993 | Kasai et al. | 250/208.1 |
| 5,382,542 A | * | 1/1995 | Zimck et al. | 437/132 |
| 5,399,206 A | * | 3/1995 | de Lyon | 437/132 |

FOREIGN PATENT DOCUMENTS

| | | | | |
|---|---|---|---|---|
| JP | 238618 | * | 10/1987 | 437/132 |
| JP | 1245512 | * | 9/1989 | 437/132 |
| JP | 0294431 | * | 4/1990 | 437/107 |

OTHER PUBLICATIONS

Ludowtse in "MOCVD of III–V semiconductors" Jr.Appl.Phys. Oct. 1985, pp. R31–55.*
Bringans et al.in "effect of interface chemistry ——" Physcal Rev.45,Jun. 1992,400–6.*
Blunier et al. in "MRS Symp.Proc. vol. 116,Apr. 1988, pp. 425–430; in Epitaxial $BaF_2$—".*
Pearsall et al. in "MRS Symp.Proc.vol. 91,Apr. 1987, pp. 287–292, optical optical properties of ——".*
P. Pongratz and H. Sitter, "Tem Analysis of Lead Telluride Films Grown by Hot–Wall Epitaxy on KCl and $BaF_2$", Journal of Crystal Growth 80 (1987), pp. 73–78.
Katsuhiko Hirabayashi and Osamu Kogure, "Epitaxial Growth of ZnS on Si by Metal Organic Chemical Vapor Deposition", Japanese Journal of Applied Physics, vol. 24, No. 12, Dec. 1985, pp. 1590–1593.
Ch. Maierhofer, S. Kularni, M. Alonso, T. Reich and K. Horn, Valence Band Offset in ZnS Layers on Si(III) by Molecular Beam Epitaxy, J. Vac.Sci, Technol. B 9(4), Jul./Aug. 1991, pp. 2238–2243.
Meiso Yokoyama, Ko–ichi Kashiro and Shin–ichi Ohta, "Substrate Temperature Effect on Crystallographic Quality and Surface Morphology of Zinc Sulfide Films on (100)–Oriented Silicon Substrates by Molecular–Beam Epitaxy", J. Appl. Phys. 60 (10), Nov. 15, 1986, pp. 3508–3511.

(List continued on next page.)

*Primary Examiner*—Robert Kunemund
(74) *Attorney, Agent, or Firm*—David Denker; Wade James Brady III; Frederick J. Telecky Jr.

(57) ABSTRACT

A method of forming lattice matched single crystal wide bandgap II–VI compound semiconductor films over a silicon substrate includes first cleaning (10) the silicon substrate. A passivation layer is formed (18), which may comprise arsenic, germanium, or $CaF_2$, among others. The lattice matched layer is then grown (26) on the passivation layer.

23 Claims, 1 Drawing Sheet

OTHER PUBLICATIONS

Meiso Yokoyama and Shin–ichi Ohta, "Growth of Crystalline Zinc Sulfide Films on a (III)–Oreinted Silicon by Molecular–Beam Epitaxy", J. Appl. Phys. 59 (11), Jun. 1, 1986, pp. 3919–3921.

M. Yokoyama, K. Kashiro, and S. Ohta, *"Molecular Beam Epitaxial Growth of ZnS on a(100)–Oriented Si Substrate,"* Journal of Crystal Growth 81 (1987), pp. 73–78.

K. Hirabayashi and O. Kogure, "Epitaxial Growth of ZnS on Si by Metal Organic Chemical Vapor Deposition," Japan Journal of Applied Physics, vol. 24, No. 12, Dec. 1985, pp. 1590–1593.

C. Maierhofer, S. Kulkarni, M. Alonso, T. Reich, and K. Horn, *"Valence Band Offset in ZnS Layers on Si(III) Grown by Molecular Beam Epitaxy,"* J. Vac. Sci. Technol. B., vol. 9, No. 4, Jul./Aug. 1991, pp. 2238–2243.

M. Yokoyama and S. Ohta, *"Growth of Crystalline Zinc Sulfide Films on a(III)–Oriented Silicon by Molecular–Beam Epitaxy,"* J. Appl. Phys. 59 (II), Jun. 1, 1986, pp. 3919–3921.

M. Yokoyama, K. Kashiro, and S. Ohta, "Substrate Temperature Effect on Crystallographic Quality and Surface Morphology of Zinc Sulfide Films on (100)–Oriented Silicon Substrates by Molecular–Beam Epitaxy," J. Appl. Phys. 60 (10), Nov. 15 1986, pp. 3508–3511.

R. D. Bringans, *"Arsenic Passivation of Si and Ge Surfaces,"* Critical Reviews in Solid State and Materials Sciences, 17(4) (1992), pp. 353–395.

\* cited by examiner

METHOD OF FORMING LATTICE MATCHED LAYER OVER A SURFACE OF A SILICON SUBSTRATE

TECHNICAL FIELD OF THE INVENTION

This invention relates generally to semiconductor technology, and more particularly to a method of forming lattice matched single crystal wide bandgap II–VI compound semiconductor films over silicon.

GOVERNMENT RIGHTS

This invention was co-funded by the Center for Space Power, a NASA-funded Center for the Commercial Development of Space and a research division of the Texas Engineering Experiment Station, a state agency and a component of The Texas A&M University System, and the U.S. Government may have certain rights in the invention.

BACKGROUND OF THE INVENTION

In the field of semiconductor technology, devices have recently become available which take advantage of the different bandgap widths of various materials. For example, nanoelectronic, quantum-effect devices can take advantage of materials having different bandgap widths to create regions of varying potential energy, to allow for realization of electron tunnelling and resonance. Other applications that make use of these different bandgap widths include blue-UV (ultraviolet) light emitting devices and high efficiency solar cells.

Much of the work in these nanoelectronic and optoelectronic devices has been based on "III–V" materials, such as gallium arsenide and indium phosphide. However, these technologies have yet to become pervasive, because they are not compatible with conventional technology and systems, which are silicon based. Thus, efforts have been underway to develop silicon compatible technologies, which would allow, for example, combining conventional devices with nanoelectronic or optoelectronic devices all on the same silicon substrate.

Several II–VI compounds present materials with bandgaps greater than that of silicon and which have lattice constants compatible with that of silicon. Thus, they are attractive as materials for forming heterostructures of the kind which would allow for silicon based implementation of devices that take advantage of different bandgap width materials. Examples of such materials include ZnS, ZnSSe, ZnSTe, CaZnS, MgZnS, MnZnS, BeMgS, and BeSeTe. The ratios of the group II or VI elements in the tertiary compounds are adjusted to match the lattice constants to that of silicon.

However, difficulties in depositing these materials at a high quality (needed for such applications) on silicon have arisen because of the chemical interaction between the lattice matched layer and the silicon. For example, sulfur in such lattice matched layers reacts to form a silicon sulfide. This silicon sulfide (which is either amorphous or polycrystalline) prevents growth of high quality single crystal materials on the silicon.

Existing techniques for growing single crystal films on silicon substrates have significant disadvantages. For example, techniques for direct molecular beam epitaxy ("MBE") growth on thermally cleaned silicon surfaces result in poor crystal quality and rough surface morphology. Furthermore, a high density of twin defects is often present in the layers grown with these techniques. Furthermore, while twin-free single crystal layers with smooth surface morphology at particular conditions have been reported with these techniques, these conditions could not be reproduced by the present inventors for layer thicknesses above 2000 angstroms. See, "Growth of Crystalline Zinc Sulfide Films on (111)-oriented Silicon by Molecular-Beam Epitaxy", Meiso Yokoyama and Shin-ichi Ohta, *J. Appl. Phys.* 59, 3919 (1986); "Substrate Temperature Effect on Crystallographic Quality and Surface Morphology of Zinc Sulfide Films on (100)-oriented Silicon Substrates by Molecular-Beam Epitaxy", Meiso Yokoyama, Io-ichi Kahsior, and Shin-ichi Ohta, *J. Appl. Phys.* 60, 3508 (1986); and "Molecular Beam Epitaxial Growth of ZnS on a (100)-oriented Si Substrate", Meiso Yokoyama, Io-ichi Kashior, and Shin-ichi Ohta, *J. Crystal Growth* 81 73 (1987).

Another technique, which involves direct MBE growth on cleaved Si(111) surfaces, has been described by Maierhofer et al., in "Valence Band Offset in ZnS Layers on Si (111) grown by Molecular Beam Epitaxy", *J. Vac. Sci. Technol.* B 9, 2238 (1991). With this technique, however, it is extremely difficult to obtain a large area material, and it is therefore not suitable for growing such crystals for device applications.

A third technique, using chemical vapor deposition, was described by Kirabayashi et al. in "Epitaxial Growth of ZnS by Metal Organic Chemical Vapor Deposition", *Japan J. Appl. Phys.* 24, 1590 (1985). This technique has significant disadvantages that are particularly apparent in the fabrication of heterostructures for quantum well structures. In particular, it presents difficulties in forming abrupt interfaces and precisely controlling layer thicknesses.

SUMMARY OF THE INVENTION

Therefore, a need has arisen for a method of forming a lattice matched single crystal wide bandgap compound over a silicon substrate that is suitable for formation of heterostructures. In accordance with the teachings of the present invention, a method of forming such a layer over a surface of a silicon substrate is provided which substantially reduces or eliminates disadvantages and problems associated with the prior approaches. In particular, a method is provided in which the silicon substrate is first cleaned. A passivation layer is then formed on the silicon substrate, and the lattice matched layer is formed on the passivation layer. In particular embodiments, the passivation layer may comprise arsenic, germanium, or $CaF_2$. Furthermore, the lattice matched layer may be a compound of group II and VI materials.

An important technical advantage of the present invention is the fact that a passivation layer is provided between a silicon substrate and a layer lattice matched to the silicon. Because of this passivation layer, a relatively wide bandgap layer can be grown and then used to form heterostructures on the silicon substrate, thereby allowing for applications such as nanoelectronics and optoelectronics to be based on and compatible with silicon technology.

BRIEF DESCRIPTION OF THE DRAWINGS

A more complete understanding of the present invention may be derived by referring to the detailed description and claims when considered in connection with the accompanying drawings, in which like reference numbers indicate like features wherein:

DETAILED DESCRIPTION OF THE INVENTION

The present invention includes forming a passivation layer between a silicon substrate and a layer of a lattice matched single crystal wide bandgap compound. This passivation layer prevents deleterious chemical reactions between the wide bandgap layer and the silicon of the substrate surface, for example between sulfur in the lattice matched layer and the silicon substrate. Therefore, the necessary interface crystal ordering is maintained for subsequent growth layers. As will be described below, the passivation layer may be arsenic, germanium, or $CaF_2$, among other suitable materials.

The process of molecular beam epitaxy ("MBE") may be used to grow the passivation layer and the wide bandgap compound layer. For example, the layers may be grown with a model V-80 molecular beam epitaxy system marketed by Fisons, Inc. Similarly, the passivation layer and the wide bandgap films can be grown using gas source molecular beam epitaxy, chemical vapor deposition or atomic layer epitaxy. It should be understood that both layers may be formed with such processes, and the same or different processes may be used in forming each layer.

Figure 1:
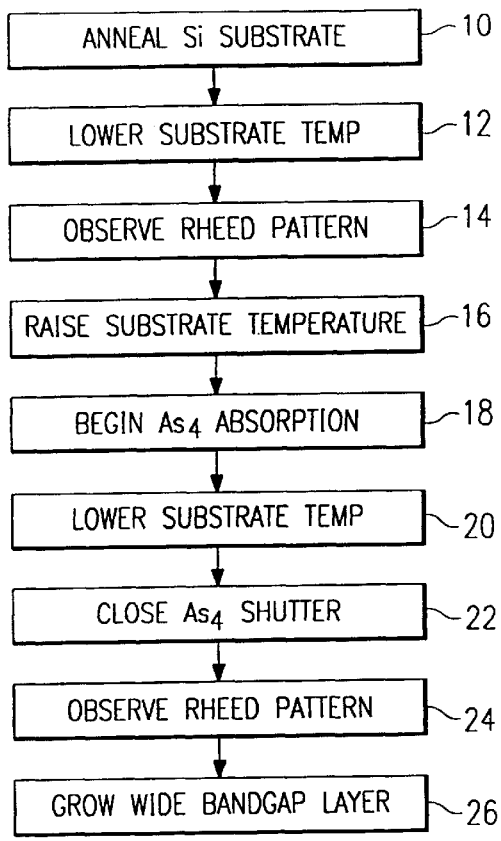
FIG. 1 is a flow diagram of a method for creating an arsenic passivated surface for growth of wide bandgap compounds according to teachings of the present invention.

FIG. 1 is a flow diagram of a method of creating an arsenic passivated surface on which wide bandgap layers lattice matched to silicon will be grown according to the teachings of the present invention. With this method, a thin-film layer of arsenic will be created on a silicon substrate. Then, relatively wide-bandgap compounds can be grown on top of the arsenic passivation layer, for formation of heterostructures as needed.

As shown in FIG. 1, a silicon substrate is annealed at step 10. This step of annealing is performed to clean (or prepare) the silicon surface. Typically, the silicon will have oxygen or hydrogen impurities at the surface, and these are cleaned away with heat treatment, chemical treatment, or ionic treatment, among other possible techniques. Any such technique is referred to herein as "cleaning."

With arsenic passivation, the silicon substrate is preferably a silicon (100) surface, whether normal or vicinal. The method of FIG. 1 may also be used with normal and vicinal Si (111) surfaces, although it is less effective with these than with the Si (100) surfaces. The silicon substrate is annealed in the growth chamber at a temperature of approximately 950° Celsius for 15 minutes. After the substrate has cooled below 700° Celsius, shown at step 12, streaky reconstruction RHEED (reflection high energy electron defraction) patterns are obtained for the substrate. For the Si (111) substrate, a (7×7) reconstruction RHEED pattern is obtained. For the Si(100) substrate, a (2×1) reconstruction RHEED pattern is obtained. These patterns are obtained at step 14 of FIG. 1. It should be understood that these RHEED patterns are obtained for purposes of monitoring the growth, and need not be obtained to grow the arsenic passivation layer or the wide bandgap layers.

After raising the substrate temperature to approximately 850° Celsius at step 16, arsenic adsorption is begun at step 18. The arsenic adsorption of step 18 involves growing one monolayer of arsenic on the silicon substrate. This monolayer may be formed using an $As_4$ beam flux pressure of $1 \times 10^{-5}$ mbar for 5 minutes. After this period, the substrate temperature is lowered to approximately 400° Celsius in approximately 10 minutes at step 20. The arsenic shutter is then closed at step 22. These steps allow formation of a monolayer of arsenic. One monolayer is grown to ensure interface crystal ordering between the silicon substrate and the wide bandgap layer. However, more layers of arsenic may be grown, with possible reduction in interface crystal ordering.

Furthermore, only one atomic layer of arsenic is preferably deposited to avoid complicated bandgap profiles for highly sensitive bandgap applications such as quantum well and double barrier structures. However, more than one atomic layer may be deposited for these and other applications without departing from the intended scope of the present invention.

At step 24, streaky reconstruction RHEED patterns are obtained to monitor the success of the arsenic adsorption. Streaky (2×1) and (1×1) RHEED patterns are obtained for the Si(100) and Si(111) substrates, respectively.

At step 26, a wide bandgap layer is formed over the arsenic passivated surface. This wide bandgap layer is chosen to be lattice matched with the underlying silicon substrate. The wide bandgap layer may be chosen from II–VI compound semiconductors, such as ZnS, ZnSSe, ZnSTe, CaZnS, MgZnS, MnZns, BeMgS, and BeSeTe, among other possible materials. The ratios of the group II or VI elements in the tertiary compounds are adjusted to match the lattice constants to that of silicon. It should be understood that these compounds are exemplary only, and any other suitable lattice matched materials, with the desired bandgap, may be used without departing from the intended scope herein.

It should be understood that the wide bandgap layer may be shaped and located so as to form heterostructures as required for particular applications. Many applications for such heterostructures are presented, such as lasers and detectors directly integrated on silicon chips for high speed optical datalinks, blue-UV lasers for optical recordings and underwater communications, blue light emitters in emissive flat panel displays, resonant tunnelling heterostructure transistors directly integrated on silicon chips, and superlattice and multi-quantum-well structures tuned to the solar spectrum for high efficiency solar cells. These are just a few of the many applications for heterostructures made available with the present invention.

Figure 2:
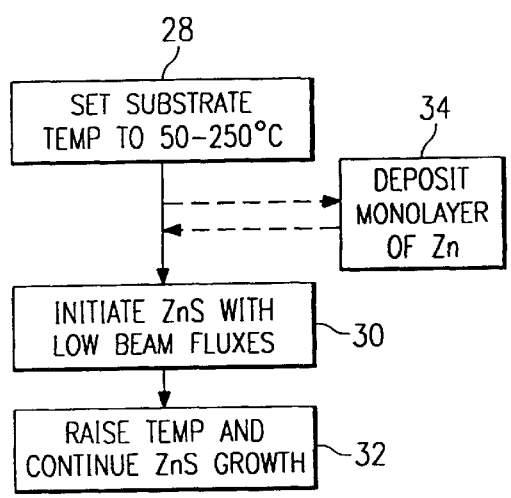
FIG. 2 is a flow diagram of a method of growing wide bandgap compounds according to the teachings of the present invention.

FIG. 2 illustrates a method of forming an exemplary wide bandgap layer. In this example, a layer of ZnS is formed with molecular beam epitaxy. As shown in FIG. 2, the silicon substrate (with the passivation layer) is brought to a temperature of approximately 50° to 250° Celsius at step 28. At step 30, ZnS growth is initiated with Zn and $S_2$ beam fluxes that correspond to a pressure of approximately $1 \times 10^{-7}$ mbar for about 1 to 2 minutes. The Zn and $S_2$ can be derived from compound or separate sources. Stoichiometry should be maintained such that uniform ZnS growth is obtained. Thus the beam flux ratio of Zn to S is generally unity. At step 32, the substrate temperature is raised to approximately 300° to 340° Celsius and ZnS is grown at a growth rate of approximately 0.4 to 0.8 micrometers per hour with a beam flux pressure of approximately 0.6 to $1.2 \times 10^{-6}$ mbar.

Step 30 is provided to ensure that the first layer of ZnS has a crystal ordering consistent with that of the silicon substrate. Once this first layer is grown at step 30, the rate of growth may be increased at step 32 to speed-up the process.

With the Si(111) surface, it has been found that a single layer of arsenic can completely prevent the reaction of sulfur with silicon. With the Si(100) surface, however, it has been found that the passivation layer may not completely prevent sulfur from reacting with silicon. Thus, step 34 is provided for further prevention of silicon and sulfur reaction, and may be used with either surface. With step 34, a monolayer of zinc is first deposited on the arsenic passivation layer before exposing the substrate to sulfur. By depositing this monolayer of zinc first, deleterious reactions between sulfur and silicon are prevented. This first layer of zinc can be created by enriching the zinc beam, or by using a shutter on a separate sulfur source, for example.

Figure 3:
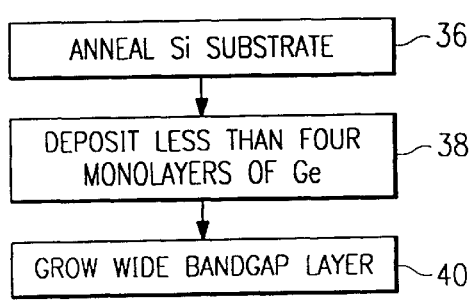
FIG. 3 is a flow diagram of a method of creating a germanium passivated surface for growth of wide bandgap compounds according to the teachings of the present invention.

FIG. 3 is a flow diagram of a method of creating a germanium passivated surface on which wide bandgap layers may be formed according to the teachings of the present invention. This process has been developed for growing heterostructures, and in particular ZnS heterostructures, on normal and vicinal Si(100) surfaces, although it can also be used to grow heterostructures on Si(111) surfaces. Germanium is attractive because it does not present contamination problems, such as may exist with arsenic.

At step 36, the silicon substrate is annealed in a growth chamber at a temperature of approximately 950° Celsius for 15 minutes. Again, this step is for cleaning away impurities. At step 38, less than 4 monolayers of germanium are deposited at a substrate temperature of 400° to 500° Celsius and at a growth rate of approximately 0.5 micrometers per hour. At step 40, a wide bandgap layer is then grown to the desired size and shape, and may be grown according to the method of FIG. 2. It should be understood that the RHEED pattern steps of FIG. 1 may be included in the growth of the germanium passivation layer.

The number of monolayers of germanium is preferably less than four, to ensure good crystal ordering and to simplify bandgap profiles. However, more than three monolayers may be used as well.

Figure 4:
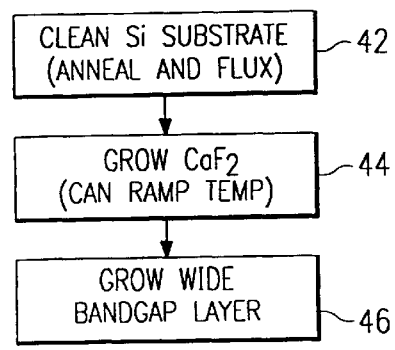
FIG. 4 is a flow diagram of a method of creating a calcium fluoride passivated surface for growth of wide bandgap compounds according to the teachings of the present invention.

FIG. 4 is a flow diagram of a method of creating a calcium fluoride passivated surface on which wide bandgap layers may be grown according to the teachings of the present invention. As shown in FIG. 4, the silicon substrate surface is cleaned by annealing the silicon in a MBE chamber at approximately 950° Celsius for 10 minutes, plus an additional 10 minutes with silicon fluxing at a rate of approximately 0.01 monolayers per second. Both Si(111) and Si(100) surfaces may be used. For the Si(111) substrate, $CaF_2$ growth is at approximately 700° Celsius, and growth on the Si(100) substrate is at approximately 600° Celsius. The base pressure of the MBE system is below approximately $1\times10^{-10}$ mbar, and a pressure of approximately $5\times10^{-10}$ mbar is used during $CaF_2$ deposition. A ramp growth temperature profile (from approximately 100° Celsius to 600° Celsius in 5 minutes) is used when the application requires high quality $CaF_2$ with an epitaxial relation identical to the substrate. The RHEED steps of FIG. 1 may also be used with the $CaF_2$ passivation layer. At step 46, the wide bandgap layer is grown, which, for example, may be according to the method shown in FIG. 2.

With the calcium fluoride passivated surface, chemical reaction between sulfur, such as that in ZnS, and silicon on a Si(111) surface is completely prevented. However, since more than one atomic layer of $CaF_2$ is provided, bandgap designs may become more complicated. Furthermore, twin defects sometimes result in the formation of wide bandgap layers on top of the $CaF_2$. Furthermore, lattice matching between certain compounds, such as ZnS, and $CaF_2$ is not optimal, and this can lead to line defects and other crystal imperfections.

In summary, a passivation layer is provided between a silicon substrate and a wide bandgap layer lattice matched to the silicon. The passivation layer may be comprised of arsenic, germanium, calcium floride, or any other suitable material. The lattice matched layer may be formed of any suitable wide bandgap material, lattice matched to the silicon substrate. Examples of such materials are compounds of Group II and Group VI elements. Furthermore, the silicon substrate surface may be <111> or <100>, and may be normal or vicinal for lattice matching to the silicon.

Although the present invention has been described in detail, it should be understood that various changes, substitutions and alterations can be made without departing from the spirit and scope of the invention as defined by the appended claims.

What is claimed is:

1. A method of forming a layer over a surface of a silicon substrate, the layer being lattice matched to the silicon substrate, comprising the steps of:
   cleaning the surface of the silicon substrate;
   forming a passivation layer having a thickness in excess of one monolayer on the silicon substrate; and
   forming the lattice matched layer on the passivation layer.
2. The method of claim 1, wherein the passivation layer comprises arsenic.
3. The method of claim 1, wherein the passivation layer comprises germanium.
4. The method of claim 1, wherein the passivation layer comprises less than four monolayers of germanium.
5. The method of claim 1, wherein the passivation layer comprises $CaF_2$.
6. The method of claim 5, and further comprising changing the temperature of the silicon substrate while forming the passivation layer of $CaF_2$.
7. The method of claim 1, wherein the lattice matched layer is a compound semiconductor formed of elements from Groups II and VI.
8. The method of claim 1, wherein the lattice matched layer is a compound selected from the group consisting of ZnS, ZnSSe, ZnSTe, CaZnS, MgZnS, MnZnS, and BeMgS.
9. The method of claim 1, wherein the step of forming the lattice matched layer comprises:
   initially growing ZnS at a first rate and a first temperature; and
   then growing the ZnS at a second rate faster than the first rate and a second temperature higher than the first temperature.
10. The method of claim 1, wherein the silicon substrate has a Si(111) surface.
11. The method of claim 1, wherein the silicon substrate has a Si(100) surface.
12. The method of claim 1, wherein the surface of the silicon substrate is normal.
13. The method of claim 1, wherein the surface of the silicon substrate is vicinal.
14. The method of claim 1, wherein the lattice matched layer is ZnS, and wherein forming the lattice matched layer comprises first forming a monolayer of zinc on the passivation layer.
15. The method of claim 1, wherein the passivation layer is formed using molecular beam epitaxy.
16. The method of claim 1, wherein the passivation layer is formed using gas source molecular beam epitaxy.
17. The method of claim 1, wherein the passivation layer is formed using chemical vapor deposition.

18. The method of claim 1, wherein the passivation layer is formed using atomic layer epitaxy.

19. The method of claim 1, wherein the lattice matched layer is formed using molecular beam epitaxy.

20. The method of claim 1, wherein the lattice matched layer is formed using gas source molecular beam epitaxy.

21. The method of claim 1, wherein the lattice matched layer is formed using chemical vapor deposition.

22. The method of claim 1, wherein the lattice matched layer is formed using atomic layer epitaxy.

23. A method of forming a layer over a surface of a silicon substrate, the layer being lattice matched to the silicon substrate, comprising the steps of:

cleaning the surface of the silicon substrate;

forming a passivation layer comprising a monolayer of germanium on the silicon substrate; and forming the lattice matched layer on the passivation layer.

* * * * *